United States Patent [19]

Delano

[11] Patent Number: 5,444,414
[45] Date of Patent: Aug. 22, 1995

[54] LOW VOLTAGE FILTER TRANSCONDUCTANCE CELL

[75] Inventor: Cary L. Delano, San Jose, Calif.

[73] Assignee: National Semiconductor Corporation, Santa Clara, Calif.

[21] Appl. No.: 68,559

[22] Filed: May 28, 1993

[51] Int. Cl.[6] .............................. H03F 3/45
[52] U.S. Cl. ..................... 327/563; 327/362; 327/552; 327/553; 330/258; 330/253
[58] Field of Search ............ 307/322, 520, 494, 521, 307/491; 328/167; 330/253, 107, 303, 258, 252

[56] References Cited

U.S. PATENT DOCUMENTS

| | | | |
|---|---|---|---|
| 4,015,146 | 3/1977 | Aihara et al. | 307/322 |
| 4,841,179 | 6/1989 | Hagino et al. | 307/520 |
| 4,918,338 | 4/1990 | Wong | 328/167 |
| 4,918,399 | 4/1990 | Devecchi et al. | 330/258 |
| 5,055,719 | 10/1991 | Hughes | 307/491 |
| 5,063,311 | 11/1991 | Swapp | 307/494 |
| 5,097,489 | 3/1992 | Tucci | 327/141 |
| 5,172,017 | 12/1992 | Schmidt | 307/491 |
| 5,182,477 | 1/1993 | Yamasaki et al. | 302/494 |

FOREIGN PATENT DOCUMENTS 2243966 11/1991 United Kingdom ............. 302/520

OTHER PUBLICATIONS

IEEE Journal of Solid-State Circuits, Apr. 1991, by Shigetaka Takagi et al. "100-MHz Monolithic Low-Pass Filters with Transmission Zeros Using NIC Integrators".

"Digitally Programmable Continuous Time Linear Phase Lowpass Filter for Hard Disk Drives" Geert A. DeVeirman, Richard G. Yamasak, Silicon Systems, Inc., Tustin, Calif.

IEEE Journal of Solid-State Circuits, vol. 27, No. 2, Feb. 1992, by Bram Nauta "A CMOS Transconductance-C Filter Technique for Very High Frequencies".

Paper 3-B.2, "CMOS Triode Transconductor Continuous Time Filters" by John Pennock, Peter Frith, R. G. Barker, Wilson Microelectronics Ltd. (Reprinted from IEEE CICC, pp. 378-381, 1986).

Paper 3-B.5, "Design Considerations for High-Frequency Continuous-Time Filters and Implementation of an Antialiasing Filter for Digital Video" by Gopinathan, Tsividis, et al. (Reprinted from IEEE J. Solid-State Circuits, vol. SC-25, No. 6, pp. 1368-1378, Dec. 1990).

William D. Llewellyn, et al., High-Speed Data Recovery (WAM 1.1: A 33Mb/s Data Synchronizing Phase-Locked-Loop Circuit, presented on Feb. 17, 1988 at the IEEE International Solid-States Circuit Conference).

National Semiconductor Mass Storage Handbook, 1989, pp. 2-29 through 2-63.

Beomsup Kim, High Speed Clock Recovery in VLSI Using Hybrid Analog/Digital Techniques, Memo #UCB/ERL M90/50, Jun. 6, 1990, Elect. Research Lab., UC, Berkeley (particularly p. 81).

Design Review Schematic—Simplified Gain Controlled Amplifier and Exponential AGC Control Combined H AGC and I AMP.

Primary Examiner—Timothy P. Callahan
Assistant Examiner—Dinh Le
Attorney, Agent, or Firm—Limbach & Limbach; H. Donald Nelson; Vincenzo D. Pitruzzella

[57] ABSTRACT

A filter transconductance cell utilizes a differential gain stage which operates with a low voltage supply. The filter transconductance cell also includes a negative impedance converter to provide the cell with a high differential output impedance. The filter transconductance cell further includes an arrangement for sensing of a common-mode signal at the input of the differential gain stage and for generating in response thereto a current which is added to each common-mode current at the output of the differential gain stage to thereby produce common-mode rejection.

14 Claims, 4 Drawing Sheets

LOW VOLTAGE FILTER TRANSCONDUCTANCE CELL

CROSS REFERENCE TO RELATED APPLICATION

This application is related to U.S. patent application Ser. No. 08/070,710 filed of even date herewith, entitled "HIGH DIFFERENTIAL OUTPUT IMPEDANCE SETTER" by Cary Loren Delano, assigned to the assignee of the present invention, and said application is incorporated herein by reference. U.S. patent application Ser. No. 08/070,710 has been abandoned in favor of file wrapper continuing application Ser. No. 08/282,752.

1. Field of the Invention

The present invention relates to transconductors and, in particular, to low voltage transconductance cells for use in filters.

2. Description of the Prior Art

The heart of a transconductance capacitor filter is the filter's transconductor cells. The filter's performance is determined by the characteristics of each of its transconductor cells. The characteristics of a desirable transconductor cell are extremely high bandwidth, low noise, low power consumption, high output and input impedances, low distortion and good common mode rejection.

Transconductance cells typically include one or more differential pairs. Referring to FIG. 1, a schematic diagram of a prior art differential pair 10 is shown. The differential pair 10 includes a first current source 12, a second current source 14, a first transistor 16, a second transistor 18 and a third transistor 20. A non-inverting input 22 is connected to the gate of the transistor 16, and an inverting input 24 is connected to the gate of the transistor 18. An inverting output 26 is connected to the junction of the current source 12 and the drain of the transistor 16. Similarly, a non-inverting output 28 is connected to the junction of the current source 14 and the drain of the transistor 18. A gate bias input 30 is connected to the gate of a transistor 20. Both of the current sources 12 and 14 are connected in common to a voltage source 32 having a potential $V_{DD}$.

In operation, the potential at the gate bias input 30 determines the amount of current which flows through the source of the transistor 20 and consequently the amount of current which flows through the source of each of the transistors 16 and 18. Thus, the potential at the gate bias input 30 sets the gain of the differential pair 10.

Since a transconductor capacitor filter requires good matching between its transconductance cells, in order to compensate for variations in manufacturing, the gate overdrive voltage, $V_{g.o.}$, must be fairly large. With respect to FIG. 1, $V_{g.o.} = V_{gate\text{-}source} - V_{threshold}$.

The differential pair 10, because of its configuration, provides common mode rejection. If the signals provided to the non-inverting input 22 and the inverting input 24 vary in unison, no differential current is produced between the non-inverting output 28 and the inverting output 26.

However, in order for the transistors 16, 18 and 20 to remain within a linear operating region, each transistor must be supplied a drain-source potential at least equal to the gate overdrive voltage $V_{g.o.}$ plus roughly 200 millivolts.

Therefore, when the differential pair of FIG. 1 operates from a supply voltage $V_{DD}$ of 2.7 volts, and actual components are used to generate the currents of the first and second current sources 12 and 14, the differential pair 10 operates on the lower edge of its capabilities, thereby limiting the bandwidth and the headroom of the differential pair 10. "Headroom" refers to the capacity to accommodate input signal swing without driving an amplifier or buffer into saturation or into a non-linear operating region.

Therefore, it would be desirable to provide a transconductance cell that both provides a high level of performance and operates with a lower supply voltage than required with prior art circuits.

SUMMARY OF THE INVENTION

The preferred embodiment of the invention is directed to a filter transconductance cell which operates with a low supply voltage. The filter transconductance cell of the present invention utilizes a differential pair gain stage which operates with a low voltage supply. The filter transconductance cell further utilizes differential pairs to function as a negative impedance converter to thereby achieve a high differential output impedance.

The above features and advantages of the present invention will become apparent from the following description and the appended claims taken in conjunction with the accompanying drawing.

DETAILED DESCRIPTION OF THE INVENTION

Figure 2:
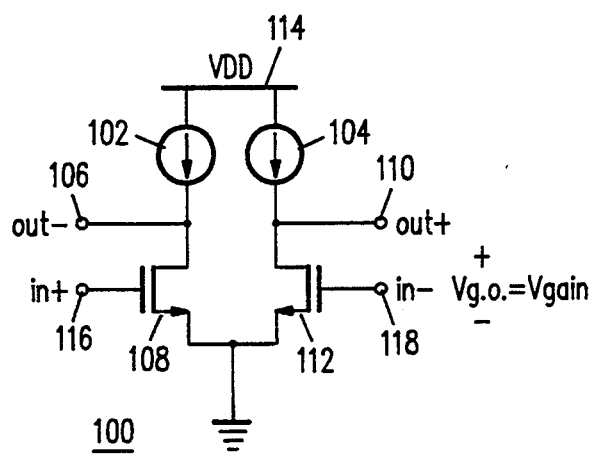
FIG. 2 is a schematic diagram illustrating a low voltage differential amplifier in accordance with the present invention.

Referring now to FIG. 2, a schematic diagram of a low voltage differential pair 100 in accordance with the present invention is shown.

The low voltage differential pair 100 includes a first current source 102 and a second current source 104. An inverting output 106 is connected to the junction of the drain of a transistor 108 and the current source 102. Similarly, a non-inverting output 110 is connected to the junction of the drain of a transistor 112 and the current source 104. The source of each of the transistors 108 and 112 is connected to common. The junction of the current sources 102 and 104 is connected to a supply voltage source 114 having a potential of $V_{DD}$. A non-inverting input 116 is connected to the gate of the transistor 108 and an inverting input 118 is connected to the gate of the transistor 112.

Figure 1:
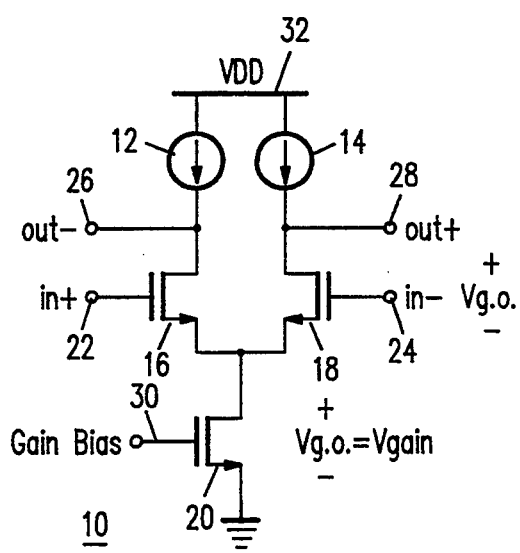
FIG. 1 is a schematic diagram illustrating a prior art differential pair.

In contrast to the differential pair 10 of FIG. 1, the required supply voltage $V_{DD}$ for the differential pair 100 is reduced by one gate overdrive voltage plus 200 millivolts since the transistor 20 of FIG. 1 is eliminated.

This allows the available supply voltage $V_{DD}$ to be more fully utilized by the transistors 108 and 112.

Thus, in contrast to the differential pair 10 of FIG. 1, for a given supply voltage, the differential pair 100 provides a higher transconductance and a resultant higher bandwidth. Another advantage of the differential pair 100 is the harmonic cancellation provided because the sources of transistors 108 and 112 are grounded.

Ideally, each transconductor-capacitor pair within a transconductance capacitor filter should have a phase shift of exactly 90° in order to prevent oscillations, as detailed further herein. By eliminating all internal nodes within the differential pair, as is the case with the differential pairs 10 and 100, FIGS. 1 and 2, respectively, the phase shift between the input and the output of the differential pair 100 is 90° when the outputs are terminated within a capacitor.

The low voltage filter transconductance cell of the present invention utilizes a negative impedance converter to raise its differential output impedance.

Figure 3:
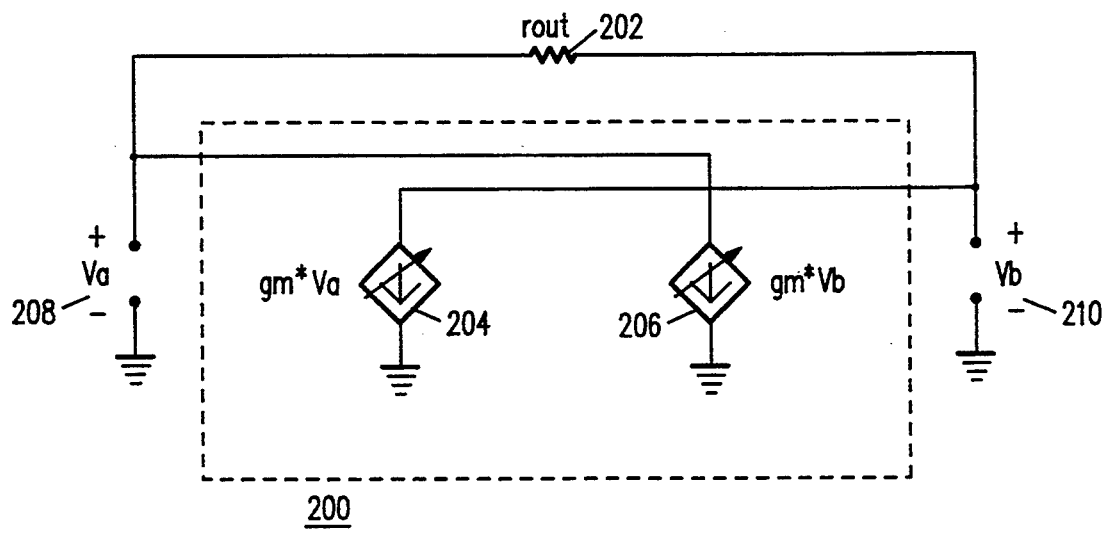
FIG. 3 is a simplified schematic diagram illustrating a negative impedance converter in accordance with the present invention.

In further detail, referring now to FIG. 3, a simplified representation of a negative impedance converter 200 that is incorporated into the present invention is shown. In general, a negative impedance converter achieves a high differential output impedance by placing a positive feedback in parallel with an output impedance 202. The negative impedance converter 200 includes a pair of cross-connected transconductance cells 204 and 206 each having a transconductance value of $g_m$. For common mode signals, the output impedance is $1/g_m$. The output impedance for differential signals, however, is equal to the parallel combination of the output impedance 202 and $(-1/g_m - 1/g_m)$. The value of this parallel combination may be either positive or negative depending upon the value of $g_m$. If the output impedance is negative and no load is connected to the converter 200, the converter 200 will latch.

The transconductance cell 204 operates as a voltage controlled current source having an output current equal to $(g_m \times V_a)$ amps, where $V_a$ is the voltage across the input 208. Similarly, the transconductance cell 206 operates as a voltage controlled current source having an output current equal to $(g_m \times V_b)$ amps, where $V_b$ is the voltage across the input 210.

If the magnitude of converter 200, i.e., $(-1/g_m - 1/g_m)$, is close to the value of the output impedance 202, the differential output impedance exhibited at the output impedance 202 will have a magnitude much greater than the output impedance 202. As detailed in the cross-referenced patent application, using a minimum number of components, the gain of the negative impedance converter 200 is set, by way of a feedback loop, to an optimum value in order to maximize the differential output impedance of a current source.

Figure 4A:
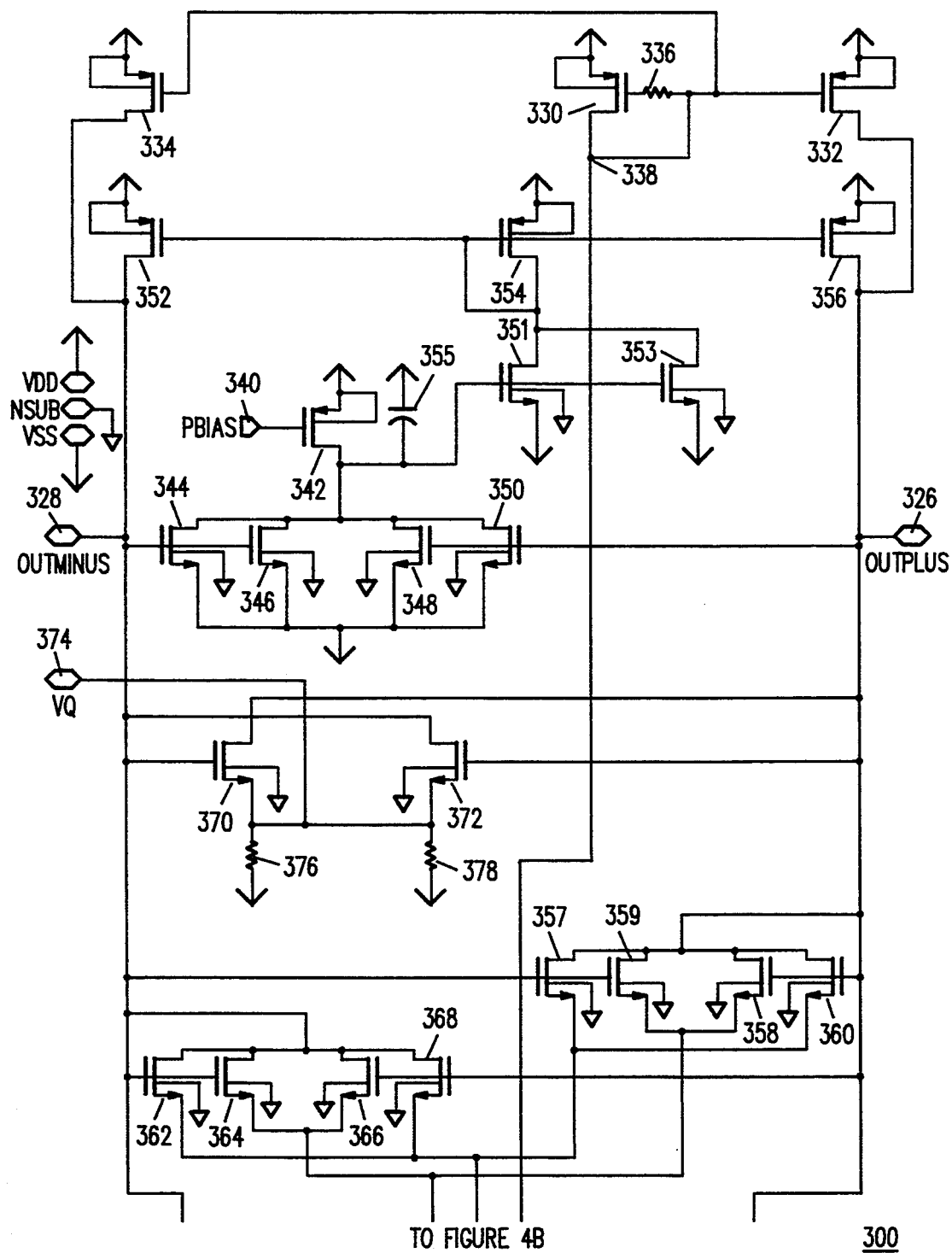
FIGS. 4A and 4B are a detailed schematic diagram of a low voltage filter transconductance cell in accordance with the present invention.
Figure 4B:
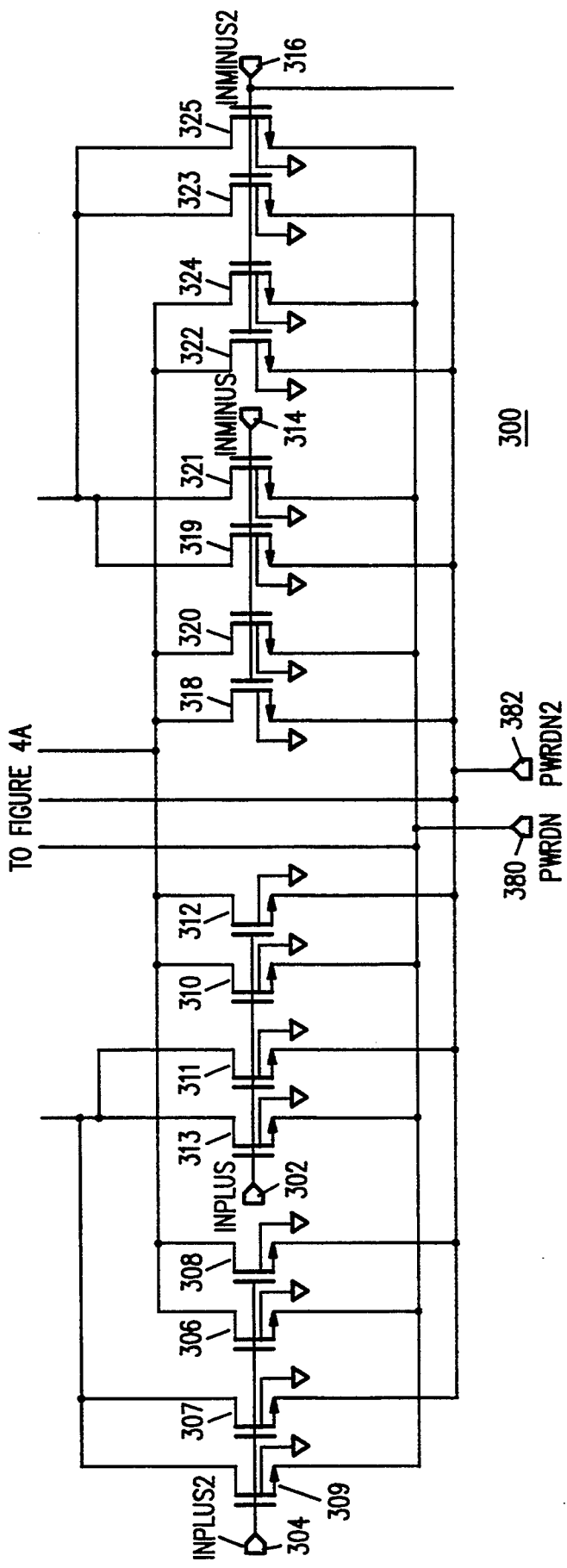

Referring now to FIGS. 4A and 4B, a detailed schematic diagram of a low voltage filter transconductance cell 300 in accordance with the present invention is shown. In the transconductance cell 300, input signals at a first non-inverting input 302 are sampled by transistors 310, 311, 312 and 313, the transistors having commonly-connected gates. Input signals at a second non-inverting input 304 are sampled by transistors 306, 307, 308, and 309, the transistors having commonly-connected gates.

Similarly, input signals at a first inverting input 314 are sampled by transistors 318, 319, 320 and 321, the transistors having commonly-connected gates. Input signals at a second inverting input 316 are sampled by transistors 322, 323, 324 and 325, the transistors having commonly-connected gates.

Because the transistors 306, 308, 310, 312, 318, 320, 322, and 324 have commonly-connected drains, any common mode currents produced by these transistors are mirrored back to a non-inverting output 326 and an inverting output 328 through transistors 330, 332 and 334. In further detail, the gates of the transistors 332 and 334 are commonly-connected to the junction of the drains of the transistors 306, 308, 310, 312, 318, 320, 322 and 324. The drain of the transistor 332 is connected to the non-inverting output 326, and the drain of the transistor 334 is connected to the inverting output 328.

The transistor 330, through a resistor 336, operates as the input to a current mirror consisting of transistors 330, 332 and 334.

A set of transistors 307, 309, 311, 313, 319, 321, 323, and 325 together operate as a differential pair that provides the gain of the transconductance cell 300.

Although an internal node 338 is present at the drain of the transistor 330, the filter transconductance cell 300 still provides adequate common mode rejection up to high frequencies. This internal node does not affect the bandwidth with respect to differential signals.

A pbias input 340 sets the common mode output level of the filter transconductance cell 300. In further detail, a potential at the pbias input 340 drives a current through source of a transistor 342. A pair of transistors 344 and 346, having commonly-connected gates, samples the potential at the inverting output 328 while a pair of transistors 348 and 350, having commonly-connected gates, samples the potential at the non-inverting output 326.

Since the drains of the transistors 344, 346, 348 and 350 are commonly-connected, the current produced at the junction of the drains represents common mode current. The addition of this common mode current to the current produced by the transistor 342 produces a voltage (potential) which adjusts the commonly-connected gates of a pair of transistors 351 and 353. A capacitor 355 at the junction of the drain of transistor 342 and the gates of transistors 351 and 353 operate to compensate the feedback loop thus preventing oscillations.

In turn, the transistors 351 and 353 produce a current, which through their commonly-connected drains is fed back to a current mirror consisting of the transistors 352, 354 and 356. In further detail, current from the junction of the drain of transistors 351 and 353 produces a voltage at the commonly-connected gates of the transistors 352, 354 and 356.

The transistor 356 in turn produces a current which is summed at the non-inverting output 326, while the transistor 352 produces a current which is summed at the inverting output 328. The transistor 354, having its base connected to its drain, operates as the input to the current mirror consisting of the transistors 352, 354 and 356. Thus, the filter transconductance cell 300 has a complete feedback loop which sets the common mode voltage at the outputs 326 and 328.

Transistors 357, 358, 359, 360, 362, 364, 366 and 368 operate as diodes for common mode signals, thereby lowering the common mode output impedance. By lowering the common mode output impedance, less compensation is required for the common mode feedback loop. For differential signals, however, the currents produced by the transistors 357, 358, 359, 360, 362, 364, 366 and 368 cancel out thereby appearing as if the currents are non-existent.

A pair of transistors 370 and 372 function as a negative impedance converter, as previously described with reference to FIG. 3. The gain of this negative impedance converter is optimally set by an external circuit through a $V_q$ input 374.

In particular, the potential at the $V_q$ input 374 determines the level of current through the resistors 376 and 378. Such an external circuit is disclosed in the above cross-referenced U.S. patent application entitled, Application Ser. Nos. 08/070,710 and 08/285,757.

In the preferred embodiment of the invention, a first power down terminal 380 and a second power down terminal are both normally connected to ground. However, by coupling only one of the first power down terminal 380 or the second power down terminal 382 to ground, the transconductance of the cell 300 can be reduced by half. Because of the configuration of the transconductance cell 300, linearity of the cell is maintained even at the lower transconductance level.

Figure 5:
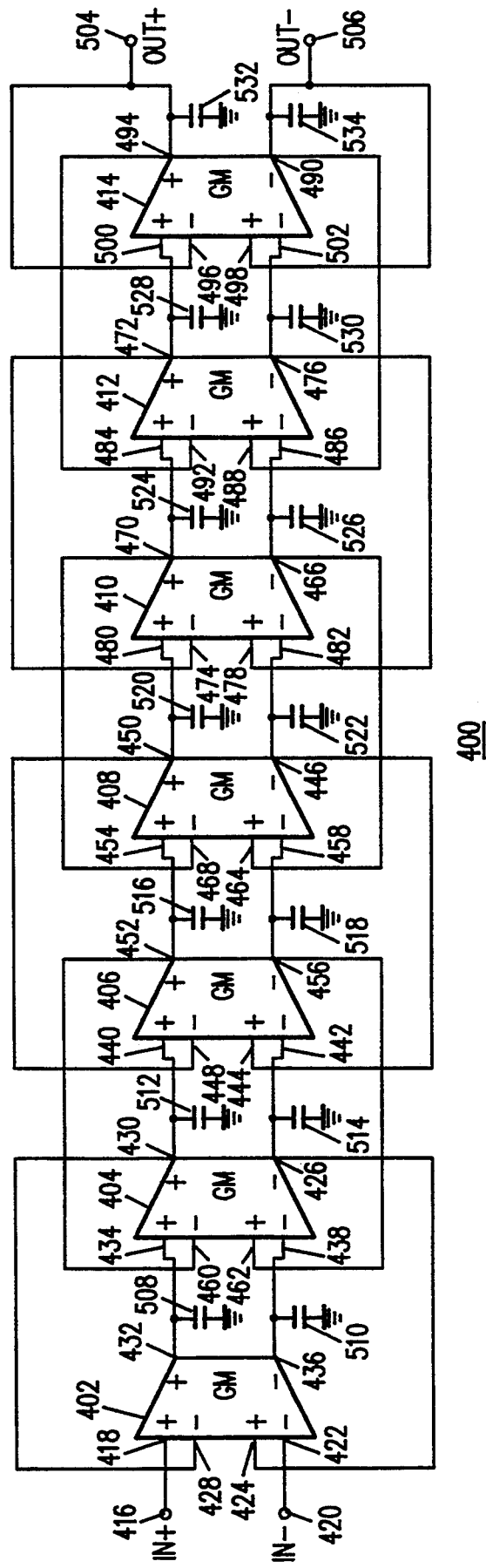
FIG. 5 is a schematic diagram of a filter which utilizes the low voltage filter transconductance cell of FIGS. 4A and 4B.

Referring now to FIG. 5, a filter application of the transconductance cell 300 of FIGS. 4A and 4B is shown. In the preferred embodiment of the invention, the filter 400 includes a set of seven transconductance cells 402, 404, 406, 408, 410, 412, and 414 to form a seven pole filter. Each of these transconductance cells corresponds to the transconductance cell 300 of FIGS. 4A and 4B.

A non-inverting filter input 416 is connected to a first non-inverting input 418 of the transconductance cell 402. An inverting filter input 420 is connected to a first inverting input 422 of the transconductance cell 402.

A second non-inverting input 424 of the cell 402 is connected to an inverting output 426 of the cell 404. A second inverting input 428 is connected to a non-inverting output 430 of the cell 404. A non-inverting output 432 of the cell 402 is connected to a first non-inverting input 434 of the cell 404. An inverting output 436 of the cell 402 is connected to a first inverting input 438 of the cell 404.

The non-inverting output 430 is further connected to a first non-inverting input 440 of the cell 406, and the inverting output 426 is further connected to a first inverting input 442 of the cell 406.

A second non-inverting input 444 of the cell 406 is connected to an inverting output 446 of the cell 408. A second inverting input 448 is connected to a non-inverting output 450 of the cell 408. A non-inverting output 452 of the cell 406 is connected to a first non-inverting input 454 of the cell 408. An inverting output 456 of the cell 406 is connected to a first inverting input 458 of the cell 406.

The non-inverting output 452 is further connected to a second inverting input 460 of the cell 404, and the inverting output 456 is connected to a second non-inverting input 462 of the cell 404.

A second non-inverting input 464 of the cell 408 is connected to an inverting output 466 of the cell 410. A second inverting input 468 is connected to a non-inverting output 470 of the cell 410. A non-inverting output 472 of the cell 412 is connected to a first inverting input 474 of the cell 410. An inverting output 476 of the cell 412 is connected to a first non-inverting input 478 of the cell 410.

The non-inverting output 450 is further connected to a second non-inverting input 480 of the cell 410, and the inverting output 446 is connected to a second inverting input 482 of the cell 410.

The non-inverting output 470 is further connected to a first non-inverting input 484 of the cell 412, and the inverting output 466 is connected to a first inverting input 486 of the cell 412.

A second non-inverting input 488 of the cell 412 is connected to an inverting output 490 of the cell 414. A second inverting input 492 is connected to a non-inverting output 494 of the cell 414. The non-inverting output 472 of the cell 412 is connected to a first non-inverting input 500 of the cell 414. An inverting output 476 of the cell 412 is connected to a first inverting input 498 of the cell 414.

The non-inverting output 494 of the cell 414 is further connected to a second inverting input 496 of the cell 414. The inverting output 490 is further connected to a second non-inverting input 498 of the cell 414.

The non-inverting output 494 is also connected to a non-inverting filter output 504, and the inverting output 490 is also connected to an inverting filter output 506.

Stray and/or placed capacitances at the outputs of each of the cells 402, 404, 406, 408, 410, 412 and 414 are represented by the capacitors 508, 510, 512, 514, 516, 518, 520, 522, 524, 526, 528, 530, 532 and 534.

In the preferred embodiment of the filter 400, each of the cells 402, 404, 406, 408, 410, 412 and 414 is identical, and except for the inputs 418 and 422, each input is driven by an output. This feedback configuration sets the common mode level at the input of each of the cells 404–414. Setting the common mode level in turn sets the gain of each of the cells. In further detail, since each of the cells 404–414 is identical there is a common mode level associated with each cell as well as a differential swing associated with each cell. The zero point of an input signal to the filter inputs 416 and 420 and the common mode level of each cell is the same. The common mode input level of the cell 402, however, is set externally using a feedback loop similar to the one in the cell 300, so that the input level is the same as the filter common mode level.

In order to maintain the bandwidth of the filter 400, if the capacitances 532 and 534 double due to output configurations, as with an integrated circuit layout, the transconductance of the cell 414 can be doubled to thereby maintain the same ratio of transconductance to stray capacitance. In order to double the transconductance of the cell 414, the transistors 362, 364, 366, 368, 357, 359, 358 and 360 of FIG. 4A are placed in parallel with transistors 309, 307, 313, 311, 319, 321, 323 and 325.

While only certain preferred embodiments have been described in detail, as will be apparent to those familiar with the art, certain changes and/or modifications can be made without departing from the scope of the invention as defined by the following claims.

I claim:

1. A low voltage filter transconductance cell having a high differential output impedance, comprising:

a differential amplifier stage having at least one non-inverting input, at least one inverting input, a non-inverting output and an inverting output;

negative impedance converter means having a first input coupled to the non-inverting output of the differential amplifier stage, a second input coupled to the inverting output of the differential amplifier stage, a first output coupled to the non-inverting output of the differential amplifier stage and a second output coupled to the inverting output of the differential amplifier stage, the negative impedance converter means operative to generate a high differential output impedance at the non-inverting and inverting outputs of the differential amplifier stage;

means for sensing a common-mode signal at each input of the differential amplifier stage; and means for generating, in response to the common-mode signal sensed at each input of the differential amplifier stage, a first current which is added at the non-inverting output of the differential amplifier stage and a second current which is added at the inverting output of the differential amplifier stage.

2. The transconductance cell of claim 1, wherein the negative impedance converter further comprises:

a first transistor having a drain, source and gate, the gate connected to the inverting output of the differential amplifier stage and the drain connected to the non-inverting output of the differential amplifier stage; and a second transistor having a drain, source and gate, the gate connected to the non-inverting output of the differential amplifier stage and the drain connected to the inverting output of the differential amplifier stage, the sources of each of the first and second transistors being connected together and coupled to a voltage input.

3. The transconductance cell of claim 1 further comprising:

means for adjusting a common-mode output level of the transconductance cell.

4. The transconductance cell of claim 1, wherein the differential amplifier stage and means for sensing further comprise:

a first set of four transistors having commonly connected gates, the commonly connected gates operative as a first inverting input;

a second set of four transistors having commonly connected gates, the commonly connected gates operative as a second inverting input;

a third set of four transistors having commonly connected gates, the commonly connected gates operative as a first non-inverting input;

a fourth set of four transistors having commonly connected gates, the commonly connected gates operative as a second non-inverting input, wherein a first transistor and a second transistor of the first set and a first transistor and a second transistor of the second set have drains connected in common to the non-inverting output, a first transistor and a second transistor of the third set and a first transistor and a second transistor of the fourth set have drains connected in common to the inverting output, a third transistor and a fourth transistor of each of the first, second, third and fourth sets having drains commonly connected to the means for generating, sources of the first and third transistors of each of the first and second sets and sources of the second and fourth transistors of each of the third and fourth sets commonly connected for selectively coupling to ground, sources of the second and fourth transistors of each of the first and second sets and sources of each of the first and third transistors of each of the third and fourth sets commonly connected for selectively coupling to ground.

5. The transconductance cell of claim 2, wherein the differential amplifier stage and means for sensing further comprise:

a first set of four transistors having commonly connected gates, the commonly connected gates operative as a first inverting input;

a second set of four transistors having commonly connected gates, the commonly connected gates operative as a second inverting input;

a third set of four transistors having commonly connected gates, the commonly connected gates operative as a first non-inverting input;

a fourth set of four transistors having commonly connected gates, the commonly connected gates operative as a second non-inverting input, wherein a first transistor and a second transistor of the first set and a first transistor and a second transistor of the second set have drains connected in common to the non-inverting output, a first transistor and a second transistor of the third set and a first transistor and a second transistor of the fourth set have drains connected in common to the inverting output, a third transistor and a fourth transistor of each of the first, second, third and fourth sets having drains commonly connected to the means for generating, sources of the first and third transistors of each of the first and second sets and sources of the second and fourth transistors of each of the third and fourth sets commonly connected for selectively coupling to ground, sources of the second and fourth transistors of each of the first and second sets and sources of each of the first and third transistors of each of the third and fourth sets commonly connected for selectively coupling to ground.

6. The transconductance cell of claim 3, wherein the differential amplifier stage and means for sensing further comprise:

a first set of four transistors having commonly connected gates, the commonly connected gates operative as a first inverting input;

a second set of four transistors having commonly connected gates, the commonly connected gates operative as a second inverting input;

a third set of four transistors having commonly connected gates, the commonly connected gates operative as a first non-inverting input;

a fourth set of four transistors having commonly connected gates, the commonly connected gates operative as a second non-inverting input, wherein a first transistor and a second transistor of the first set and a first transistor and a second transistor of the second set have drains connected in common to the non-inverting output, a first transistor and a second transistor of the third set and a first transistor and a second transistor of the fourth set have drains connected in common to the inverting output, a third transistor and a fourth transistor of each of the first, second, third and fourth sets having drains commonly connected to the means for generating, sources of the first and third transistors of each of the first and second sets and sources of the second and fourth transistors of each of the third and fourth sets commonly connected for selectively coupling to ground, sources of the second and fourth transistors of each of the first and second sets and sources of each of the first and third transistors of each of the third and fourth sets commonly connected for selectively coupling to ground.

7. The transconductance cell of claim 1, wherein the means for generating further comprise:
- a first transistor having a drain, source and gate, the drain coupled to the means for sensing, the source coupled to a supply voltage and the gate resistively coupled to its drain;
- a second transistor having a drain, source and gate, the drain coupled to the non-inverting output of the differential amplifier stage, the gate coupled to the drain of the first transistor and the source coupled to the supply voltage; and
- a third transistor having a drain, source and gate, the drain coupled to the inverting output of the differential amplifier stage, the gate coupled to the drain of the first transistor and the source coupled to the supply voltage.

8. The transconductance cell of claim 2, wherein the means for generating further comprise:
- a first transistor having a drain, source and gate, the drain coupled to the means for sensing, the source coupled to a supply voltage and the gate resistively coupled to its drain;
- a second transistor having a drain, source and gate, the drain coupled to the non-inverting output of the differential amplifier stage, the gate coupled to the drain of the first transistor and the source coupled to the supply voltage; and
- a third transistor having a drain, source and gate, the drain coupled to the inverting output of the differential amplifier stage, the gate coupled to the drain of the first transistor and the source coupled to the supply voltage.

9. The transconductance cell of claim 3, wherein the means for generating further comprise:
- a first transistor having a drain, source and gate, the drain coupled to the means for sensing, the source coupled to a supply voltage and the gate resistively coupled to its drain;
- a second transistor having a drain, source and gate, the drain coupled to the non-inverting output of the differential amplifier stage, the gate coupled to the drain of the first transistor and the source coupled to the supply voltage; and
- a third transistor having a drain, source and gate, the drain coupled to the inverting output of the differential amplifier stage, the gate coupled to the drain of the first transistor and the source coupled to the supply voltage.

10. The transconductance cell of claim 4, wherein the means for generating further comprise:
- a first transistor having a drain, source and gate, the drain coupled to the means for sensing, the source coupled to a supply voltage and the gate resistively coupled to its drain;
- a second transistor having a drain, source and gate, the drain coupled to the non-inverting output of the differential amplifier stage, the gate coupled to the drain of the first transistor and the source coupled to the supply voltage; and
- a third transistor having a drain, source and gate, the drain coupled to the inverting output of the differential amplifier stage, the gate coupled to the drain of the first transistor and the source coupled to the supply voltage.

11. The transconductance cell of claim 5, wherein the means for generating further comprise:
- a first transistor having a drain, source and gate, the drain coupled to the means for sensing, the source coupled to a supply voltage and the gate resistively coupled to its drain;
- a second transistor having a drain, source and gate, the drain coupled to the non-inverting output of the differential amplifier stage, the gate coupled to the drain of the first transistor and the source coupled to the supply voltage; and
- a third transistor having a drain, source and gate, the drain coupled to the inverting output of the differential amplifier stage, the gate coupled to the drain of the first transistor and the source coupled to the supply voltage.

12. The transconductance cell of claim 6, wherein the means for generating further comprise:
- a first transistor having a drain, source and gate, the drain coupled to the means for sensing, the source coupled to a supply voltage and the gate resistively coupled to its drain;
- a second transistor having a drain, source and gate, the drain coupled to the non-inverting output of the differential amplifier stage, the gate coupled to the drain of the first transistor and the source coupled to the supply voltage; and
- a third transistor having a drain, source and gate, the drain coupled to the inverting output of the differential amplifier stage, the gate coupled to the drain of the first transistor and the source coupled to the supply voltage.

13. A low voltage filter transconductance cell having a high differential output impedance, comprising:
- a differential amplifier stage having at least one non-inverting input, at least one inverting input, a non-inverting output and an inverting output;
- a first transistor having a drain, source and gate, the gate connected to the inverting output of the differential amplifier stage and the drain connected to the non-inverting output of the differential amplifier stage;
- a second transistor having a drain, source and gate, the gate connected to the non-inverting output of the differential amplifier stage and the drain connected to the inverting output of the differential amplifier stage, the sources of each of the first and second transistors being connected together and coupled to a voltage input;
- means for adjusting a common-mode output level at the outputs of the transconductance cell;
- means for sensing a common-mode signal at each input of the differential amplifier stage; and
- means for generating, in response to the common-mode signal sensed at each input of the differential amplifier stage, a first current which is added at the non-inverting output of the differential amplifier stage and a second current which is added at the inverting output of the differential amplifier stage.

14. A transconductance cell having a high differential output impedance, comprising:
- differential amplifier means having at least one non-inverting input, at least one inverting input, a non-inverting output and an inverting output;
- negative impedance converter means having a first input coupled to the non-inverting output of the differential amplifier means, a second input coupled to the inverting output of the differential amplifier means, a first output coupled to the non-inverting output of the differential amplifier means and a second output coupled to the inverting output of the differential amplifier means, the negative impedance converter means operative to generate a high differential output impedance at the non-inverting and inverting outputs of the differential amplifier means; and means for generating, in response to a common-mode signal sensed at each input of the differential amplifier means, a first current which is added at the non-inverting output of the differential amplifier means and a second current which is added at the inverting output of the differential amplifier means.

* * * * *